US011516938B2

(12) United States Patent
Nizinkiewicz

(10) Patent No.: US 11,516,938 B2
(45) Date of Patent: Nov. 29, 2022

(54) POWER DISTRIBUTION ASSEMBLY

(71) Applicant: THE SECRETARY OF STATE FOR FOREIGN AND COMMONWEALTH AFFAIRS, Cheltenham (GB)

(72) Inventor: Rudi Nizinkiewicz, Cheltenham (GB)

(73) Assignee: The Secretary of State for Foreign and Commonwealth Affairs, Cheltenham (GB)

(*) Notice: Subject to any disclaimer, the term of this patent is extended or adjusted under 35 U.S.C. 154(b) by 0 days.

(21) Appl. No.: 16/982,878

(22) PCT Filed: Mar. 26, 2019

(86) PCT No.: PCT/GB2019/000052
§ 371 (c)(1),
(2) Date: Sep. 21, 2020

(87) PCT Pub. No.: WO2019/186092
PCT Pub. Date: Oct. 3, 2019

(65) Prior Publication Data
US 2021/0007244 A1 Jan. 7, 2021

(30) Foreign Application Priority Data
Mar. 27, 2018 (GB) ..................... 1804875

(51) Int. Cl.
H05K 7/20 (2006.01)
H05K 7/14 (2006.01)
(52) U.S. Cl.
CPC ....... *H05K 7/20236* (2013.01); *H05K 7/1492* (2013.01); *H05K 7/209* (2013.01); *H05K 7/20272* (2013.01); *H05K 7/20281* (2013.01)

(58) Field of Classification Search
None
See application file for complete search history.

(56) References Cited

U.S. PATENT DOCUMENTS 10,028,409 B1* 7/2018 Metzler .............. H05K 7/20936
10,317,972 B2* 6/2019 Jen .......................... G06F 1/266
(Continued)

FOREIGN PATENT DOCUMENTS

CN 102342191 A 2/2012
CN 104904075 A 9/2015
(Continued)

OTHER PUBLICATIONS

United Kingdom Pat. Appl. No. GB1804875.1, Search Report dated Aug. 13, 2018, 3 pages.
(Continued)

*Primary Examiner* — Courtney L Smith
(74) *Attorney, Agent, or Firm* — Kilpatrick Townsend & Stockton LLP

(57) ABSTRACT

A power distribution assembly is disclosed for use with at least one computer in a data centre. The power distribution assembly (11) comprises i) at least one controller (14) comprising at least one heat sensitive component (16) and ii) at least one cooling arrangement (17) comprising a casing (18) configured to contain a coolant (19). At least a portion of the coolant (19) is configured to come into contact with at least part of the controller (14) and/or at least one component for transferring heat away from the at least one controller (14)/component (16) towards at least one wall of the casing (18). This arrangement ensures that even in increased temperature data centres, there is provided consistent and reliable operation of heat sensitive components in smart power strips through dedicated cooling of the components (16).

25 Claims, 4 Drawing Sheets

(56) References Cited

U.S. PATENT DOCUMENTS

| | | | |
|---|---|---|---|
| 10,481,650 B2* | 11/2019 | Saito | H05K 7/20763 |
| 10,820,447 B1* | 10/2020 | Miyamura | G06F 1/20 |
| 2010/0328889 A1 | 12/2010 | Campbell et al. | |
| 2013/0063854 A1* | 3/2013 | Soffer | F28D 15/0275 |
| | | | 361/103 |
| 2014/0126116 A1 | 5/2014 | Irons | |
| 2014/0218859 A1* | 8/2014 | Shelnutt | G06F 1/206 |
| | | | 361/679.46 |
| 2015/0070846 A1 | 3/2015 | Shelnutt et al. | |
| 2017/0177041 A1* | 6/2017 | Shelnutt | G06F 1/20 |
| 2017/0181314 A1 | 6/2017 | Leigh et al. | |
| 2017/0290198 A1* | 10/2017 | Shepard | H05K 7/20236 |
| 2019/0280442 A1 | 9/2019 | Irons | |

FOREIGN PATENT DOCUMENTS

| | | | |
|---|---|---|---|
| WO | 2017069761 A1 | 4/2017 | |
| WO | 2017072095 A1 | 5/2017 | |

OTHER PUBLICATIONS

International Pat. Appl. No. PCT/GB2019/000052, International Search Report and Written Opinion dated Jun. 17, 2019, 13 pages.
United Kingdom Pat. Appl. No. GB1904098.9, Combined Search and Examination Report dated Sep. 5, 2019, 9 pages.
United Kingdom Pat. Appl. No. GB1904098.9, Examination Report dated Jun. 16, 2020, 2 pages.
China Patent Application No. 201980022148.6, Office Action, dated Sep. 3, 2021.

\* cited by examiner

POWER DISTRIBUTION ASSEMBLY

This invention relates to a power distribution assembly, in particular a power distribution assembly for use in high density commodity compute.

It is well known that computers generate heat when they are in use. This heat is dispersed away from the computer by means of fans or other cooling techniques. When a number of computers are arranged in a vertically stacked configuration, for example in a rack of a data centre, the temperature increase to the exhaust region at the rear of the rack is significant. This therefore leads to the requirement for the space containing the compute to be cooled to ensure reliable operation of the compute. However, the cooling of the compute in for example data centres is energy consuming and its impact on the environment can be significant. Further, the cooling of the equipment can be extremely expensive and therefore is undesirable for the user.

One solution is to utilise data centre immersion cooling whereby the IT hardware is directly immersed in a non-electrically conducting liquid which transfers heat away from the compute by means of convection of the liquid. However, it is extremely expensive to convert standard data centres to accommodate immersion cooling because the equipment requires significant physical modification including the installation of cooling tanks for containing the non-electrically conducting liquid and the compute. Further the compute must be installed in the tanks with bulky mechanical lifting equipment. Such an arrangement introduces additional Health and Safety concerns, for example as a result of the potential for spillage of the liquid causing surfaces to become slippery. When further considering the fact that the tanks are heavy and take up valuable space in the data centre it is clear that eliminating the need for immersion tanks is desirable since it would free up much needed space for an increased number of computers, it removes the need for lifting heavy equipment and spill bags and it beneficially simplifies the operational set up.

The continual development of computing devices results in them becoming more robust and efficient such that their internal components can operate in greater temperatures than ever before.

ASHRAE® energy standards for data centres are in place to encourage a good working practice relating to meeting a minimum energy efficiency which is ultimately of benefit to the environment.

To mirror the increased temperature resilience of computer devices, the temperatures within compute storage areas that are required to comply with the ASHRAE® standard have also been steadily increasing over recent years and are expected to be increased further in the future as computing devices become even more resilient.

Compute which are widely installed in racks, are generally electrically connected to a main power source via the power strip or Power Distribution Unit. The power strips are becoming increasingly more intelligent and are not only formed of the required number of sockets and other connectors, but also comprise a control unit that is capable of enabling networking and port switching, as well as including sensors for monitoring parameters of the compute and the room in which it is contained.

As the demand for greater densities of compute becomes a reality the number of associated cables connected between the compute and the power strip inevitably increases and the temperatures presented to the power strip also increase.

In current systems the compute is the constraint to the operation conditions of a space containing high density commodity compute, for example a data centre. However as the systems evolve, it is envisaged that the control element of the power strip will become the future constraint on the system. The sockets are unaffected by the rise in temperature, but certain components located adjacent to the sockets or within the control unit, for example the relays are temperature sensitive and reliability can be reduced once a predetermined temperature threshold has been exceeded.

Therefore, embodiments of the present invention are intended to address at least some of the above described problems and desires. In particular there is provided a means of utilising current widely existing data centre infrastructure whilst enabling cooling of the heat sensitive components contained in the power distribution assembly to ensure consistent and reliable operation of the relays associated with the control unit.

According to a first aspect of the invention there is provided a power distribution assembly for use with at least one computer in a data centre comprising:

At least one controller comprising at least one heat sensitive component; and
at least one cooling arrangement including a casing and a non-electrically conductive fluid, at least a portion of the coolant being configured to come into contact with at least part of the controller for transferring heat away from the at least one controller and/or at least one component.

Such an arrangement can be applied to existing standard data centre infrastructure and other high density commodity compute infrastructures as required. The controller is in its simplest form a single component, for example a relay, which may be located on a circuit board, or indeed the controller may be a more complex circuit that incorporates a relay component that is heat sensitive. The relay may, for example control the operation of a power socket located on the power distribution assembly. The objective is to protect all of the heat sensitive components located in the controller of the power distribution assembly which are vulnerable to the operating temperature in the space or room in which it is located. This means that there may be several cooling assemblies (comprising the casing and the fluid) located at various locations on the power distributions assembly. In some instances only part of the controller and/or component needs to make contact with the fluid for a sufficient amount of thermal energy to be moved away from the vulnerable components. The thermal energy is moved away via convection of the fluid.

Both the coolant and the controller and/or heat sensitive component are located within the casing.

The walls of the casing are separate and distinct from the main structure of the support structure of the power distribution assembly. Alternatively, at the very least, at least two of the walls of the casing are separate and distinct from the main structure of the power distribution assembly. This enables a void region to be created that is separate and distinct from the void created by the main structure of the power distribution assembly. This reduces the volume at which the cooling effect is to be applied compared to existing arrangements and therefore offers a more targeted cooling technique to the controller of the power strip.

The component may be substantially immersed in the non-electrically conductive fluid. This provides a maximised cooling effect, thereby optimising the reduction of the temperature of the vulnerable components.

The non-electrically conductive fluid is hermetically sealed within the casing. This ensures that there is no evaporation or leakage of the fluid.

At least one wall of the casing may comprise a thermally conductive material. Therefore, thermal energy may be transferred from the fluid to the at least one wall of the casing, thereby helping to remove the thermal energy from the heat sensitive components. The amount of coolant contained within the casing remains constant. This is because the fluid is sealed in the casing. The pressure and volume of the coolant remains substantially constant, even with slight temperature differentials applied which cause convection effects within the interior of the casing.

The casing may comprise at least one protrusion that extends from an internal and/or external surface of the casing so as to increase the surface area of the casing wall. This also aids the transfer of thermal energy away from the heat sensitive components.

A heat sink may be located in thermal communication with at least a portion of the casing via a thermal link. The heat sink also helps to remove thermal energy from the casing to enable continuous transfer of thermal energy between the convected fluid and the walls of the casing. It also prevents the casing from overheating.

An electrical transfer means may be configured to pass through a wall of the casing via a fluid tight seal. Whilst the relays need to be protected, they also need to be able to carry out their role and as such will need to be connected to the circuitry so as to permit switching of the operational state of the sockets or other electrical means located on the power distribution assembly, for example sensors.

The power distribution assembly may further comprise a fluid agitator for moving or increasing the flow of the coolant within the casing, for example the fluid agitator may take the form of a pump, or a displaceable mechanical component, for example a rotor. These agitators may aid the transfer of heat away from the heat sensitive components.

In use the operational temperature at the controller may be of a value that is less than the boiling point of the non-electrically conducting fluid. This ensures that the boiling point of the fluid is never reached (for atmospheric pressure) and that the system remains in a single phase state.

There may be provided a user interface to enable operation of the controller. The user interface may be accessible on site and may contain buttons, or a touch screen that permits the user to set the desired operation conditions, for example the switching of ports.

An electrical transfer means may extend between the user interface and the controller so as to provide electrical communication between the user interface and the controller, whereby at least a portion of the electrical transfer means passes through the fluid. The electrical transfer means may be a wire. The wire must pass through the casing wall via a seal arrangement to prohibit leakage of the coolant and to ensure the hermetic sealing of the fluid is maintained.

A thermally insulating layer may be configured intermediate to the external surface of the casing and the user interface. This ensures that the heat which is transferred to the casing wall is not permitted to pass to the user interface (which may itself contain heat sensitive components). Of course in the case that the room is of a temperature that is greater than the temperature of the casing this thermally insulating layer is not required. In fact it is envisaged that the thermally insulating layer may be removable to provide the user with a choice of whether to apply it or not. Further the selection and configuration of the thermally insulating layer may be automated and dependent upon sensed parameters, for example the temperature of the room when compared to the temperature of the casing. The insulating material must adhere to fire safety regulations, for example a halogen free plastic such as a halogen free nylon would be an appropriate material.

The power distribution assembly may further comprise at least one connector located on the user interface to permit access and control of the controller from a remote location. The connector may comprise a RJ45 connection cable or USB. This ensures that the operator does not have to be on site in order to select operational features of the power distribution assembly or to monitor the operational conditions of the power distribution assembly.

The interface may be positioned adjacent to but separate and distinct from the casing and the thermally insulating layer may as a result not be required.

The combination of the cooling arrangement, the controller and the user interface may be located within an aperture located in a support structure. The support structure may, for example be an elongate, extruded steel box formed of two cooperable parts that can be fixed together by screws, or other known fixing means. The support structure may be configured to be attached to a rack assembly or other suitable compute support structure.

The fluid may be a liquid, for example a mineral oil. Liquids are known to have better thermal transfer properties than a gas and mineral oil has been shown to have excellent electrical insulation properties which are required for this cooling application.

A server may comprise at least one computer and at least one power distribution assembly incorporating any of the before-mentioned features. A data centre may comprise at least one before-mentioned server.

In an alternative embodiment of the invention there is provided a method of cooling for use with a computer powered by a power distribution assembly, the power distribution assembly having at least one casing for containing a controller comprising at least one heat sensitive component and a coolant, al: least a portion of the controller and/or component is configured to come into contact with the coolant, the method comprising:

transferring heat away from the controller and/or component to at least one wall of the casing via the coolant.

The method may further comprise the controller being immersed in the coolant which may comprise a non-electrically conductive fluid.

The method may further comprise the casing having at least one thermally conducting wall. The thermal energy from inside the casing is conducted via the at least one thermally conducting wall to the exterior of the casing.

The method may further comprise removing thermal energy from the casing by means of a heat sink. The heat sink is thermally coupled to the at least one wall of the casing via a thermal link.

The method may further comprise agitating the non-electrically conductive coolant so as to increase the transfer of thermal energy between the at least one controller and/or component and the casing (via the coolant).

Whilst the invention has been described above it extends to any inventive combination of the features set out above, or in the following description, drawings or claims. For example, any features described in relation to any one aspect of the invention is understood to be disclosed also in relation to any other aspect of the invention.

The invention will now be described, by way of example only, with reference to the accompanying drawings, in which:—

Figure 1:
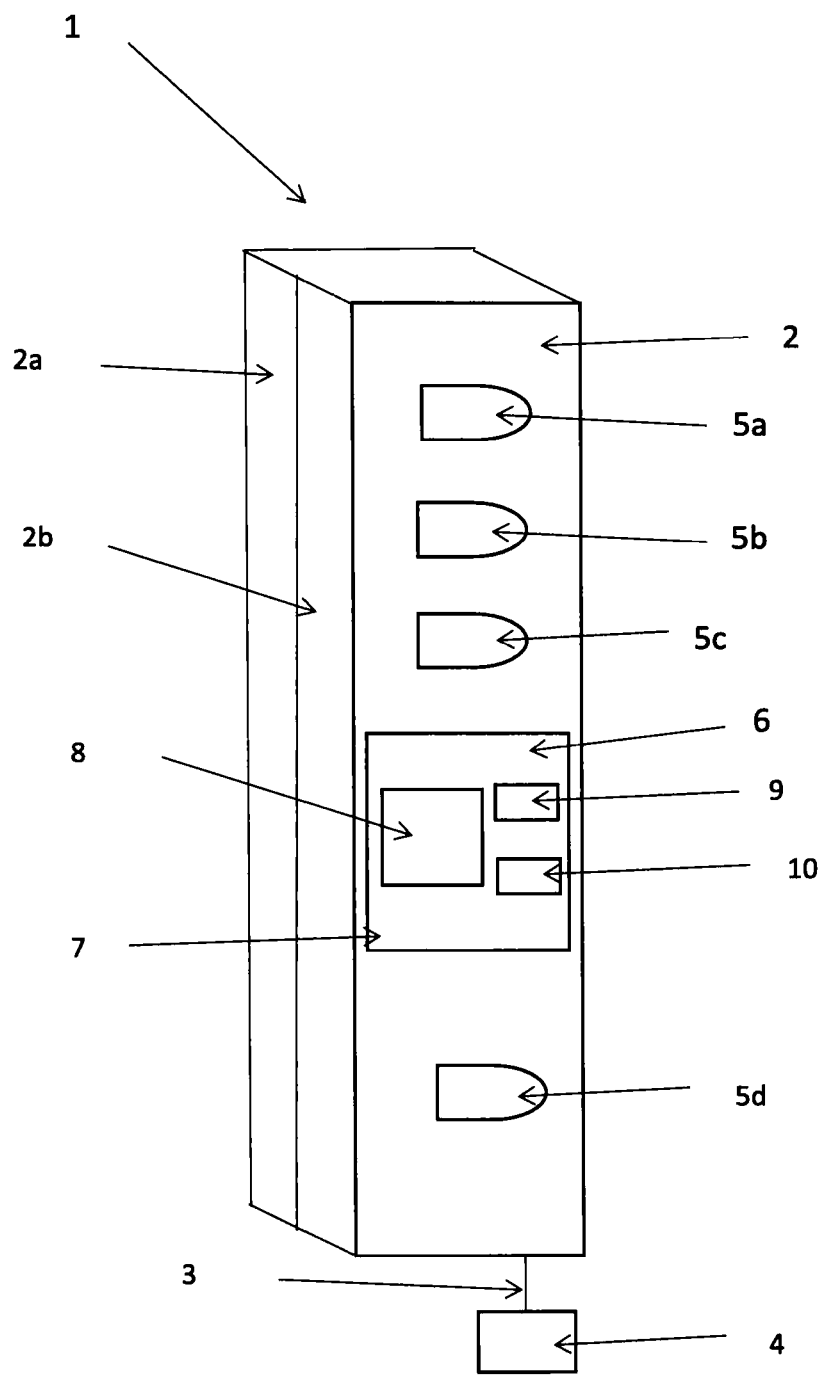
FIG. 1 is a schematic of a prior art power distribution unit.

Referring firstly to FIG. 1, there is shown a power distribution strip 1 to be located on a rack to the rear of an array of computers (not shown). At the front of the array there is located an air inlet that permits the passage of air through the array to the back of the array. This passage of air is used to cool the computer array. The air that is blown out of the back is of a higher temperature to the air that is passed into the air inlet at the front of the array. The hot air is exhausted onto the region where the power strip is positioned. The power strip is formed of an elongate steel extrusion formed of two cooperable parts 2a, 2b and on one side there is positioned a panel with at least one socket. The sockets can be of varying types that are selected at the time of manufacture of the power strip and may be provided in varying orientations as desired. It is common for the power strip 1 to be formed of an extruded steel support structure 2. A power cable 3 transfers electrical power from a mains power source 4 for example a plug to be received by a cooperable mains socket located in the room (not shown). The electrical power is transferred to the compute by means of the power sockets 5a, 5b, 5c, 5d. The power strip 1 also includes a control unit 6 or micro computer to enable the networking of the compute to be controlled and to permit switching of ports as desired.

The micro computer or control unit 6 includes a microprocessor and memory (not shown). A user interface 7 is used to control the micro computer or control unit 6 and to permit the user to program the operation and sensing of elements (not shown) associated with the power distribution strip 1, the computer array and its surroundings. The micro computer or control unit 6 is located within an aperture (not shown) located in the elongate steel extrusion 2. A user display 8 shows operational properties of the power strip 1 and buttons 9 or other switching means can be used by the user to select the desired operational features. Further the control unit 6 can be operated remotely via a USB 10.

In use the micro computer, which is located inside the support structure, experiences localised heating and can lose reliability. The power strip may be actively cooled by forcing air or another fluid through the exterior or interior of the power strip.

Figure 2:
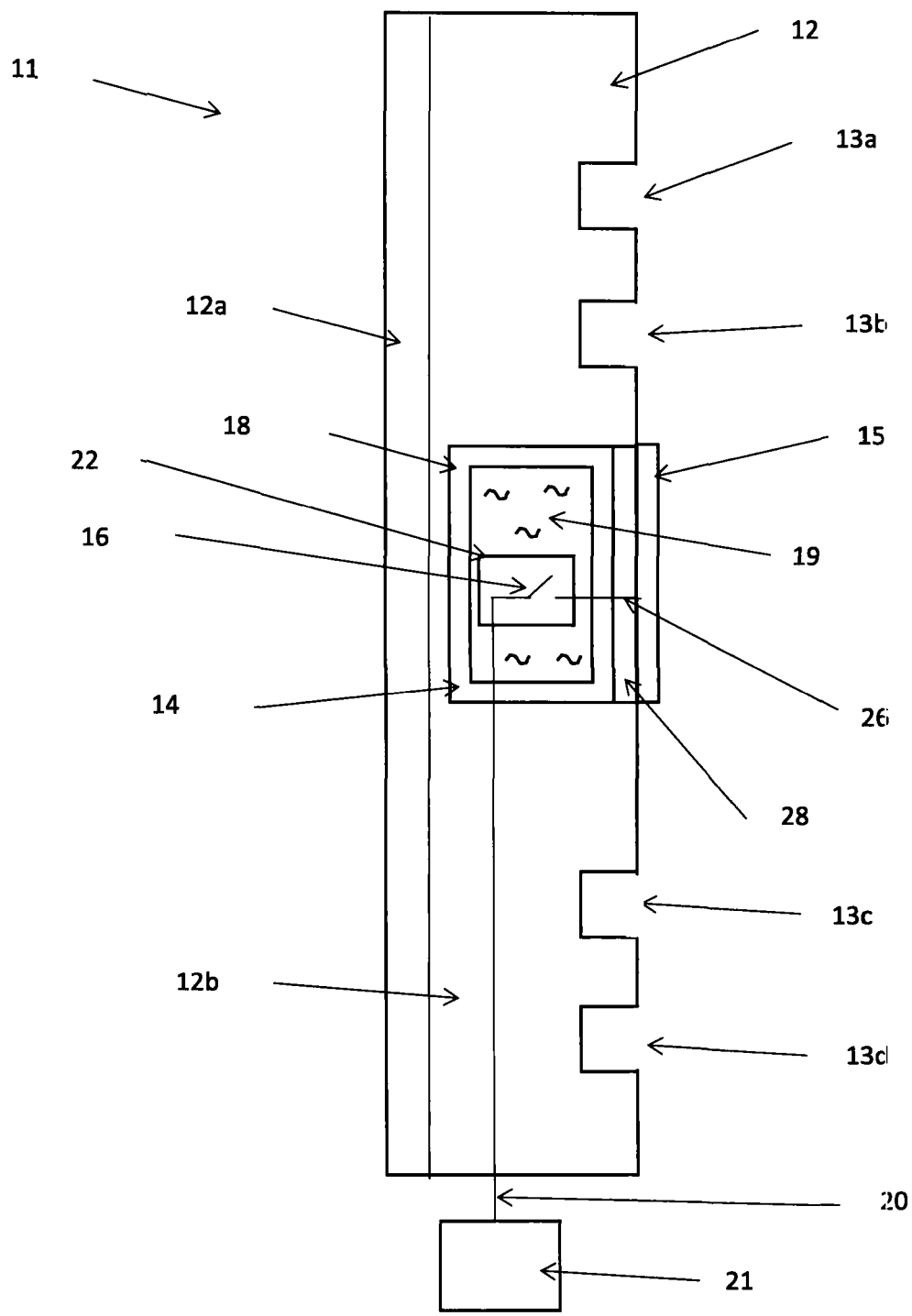
FIG. 2 is a schematic of the power distribution unit according to an aspect of the assembly.

FIG. 2 shows the power strip 11 according to the invention described herein. The support structure 12 is provided by an elongate steel extrusion formed of two cooperable parts 12a, 12b and which is terminated by electrically insulating end caps e.g. formed of plastic, for example a halogen free plastic (not shown). A panel is positioned on one side of one of the cooperable parts of the steel extrusion. Sockets 13a, 13b, 13c, 13d are located on the panel, the types of sockets and their positions are predetermined at the point of manufacture.

The support structure 12 also includes an aperture (not shown) for receiving a control unit 14 or micro computer that offers advanced features, for example sensing and management of the computer array, the rack, the sockets 13a, 13b, 13c, 13d and the data centre itself. The controller may be managed at the rack via a user interface 15, or alternatively a wireless transceiver (not shown) may be utilised such that a user can send instructions to the controller from a remote location. The control unit 14 or microcomputer will include a microprocessor and memory (not shown) as well as other electronic components to permit intelligent control of desired features of the compute within the data centre.

The relays 16 of the control unit 14 are particularly temperature sensitive and once a temperature threshold is exceeded, the relays 16 can lose reliability. For this reason, there is included a cooling arrangement 17 specifically for cooling the heat sensitive components located inside the power strip 11. The cooling arrangement comprises a thermally conductive casing 18, for example formed of a metal, that encases a coolant 19, which can be described as a non-electrically conductive fluid. In FIG. 2, the coolant 19 is a liquid that has a high dielectic strength and a suitable viscosity to permit convection. The space within the casing 18 that is filled with the fluid 19 is hermetically sealed and permits convection when temperature differentials form within the fluid 19. This arrangement therefore permits the heat energy transfer through the bulk movement of molecules in the fluid. The walls of the casing 18a, 18b, 18c, 18d are heat conducting and as such when the hotter volume fluid makes contact with the walls of the casing 18a, 18b, 18c, 18d the thermal energy is conducted outwardly to the surrounding environment.

Therefore, importantly the cooling effect is provided by immersing either partially or in entirety the heat sensitive components in a coolant located within a sealed enclosure provided by the walls of the casing, wherein the walls are heat conducting.

Power is supplied to the smart power strip via a power cable 20 which is terminated by a main plug 21.

Figure 3:
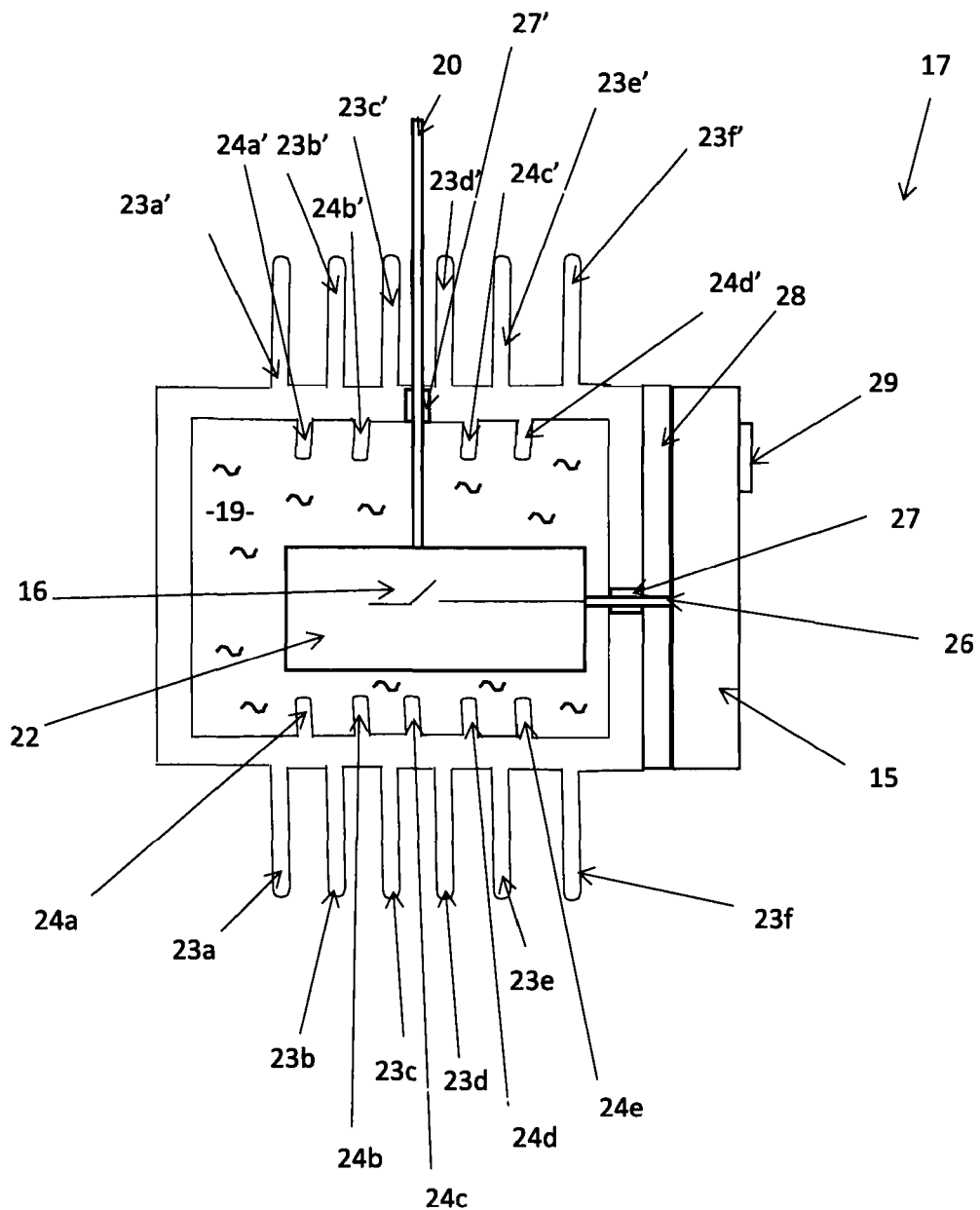
FIG. 3 is a schematic of the cooling apparatus and user panel arrangement of FIG. 2.

Referring to FIG. 3, the surface area of the walls of the casing 18a, 18b, 18c, 18d are increased by utilising fins 23, 24 or channels so as to maximise on the contact regions between the fluid undergoing convection and the conductive material of the casing 18 and therefore maximise the heat transfer from the liquid 19 to the external surroundings and/or with the inclusion of a heat sink. This technique is well known in the field of heat exchangers. The thermal energy is therefore moved away from the temperature sensitive components located within the power strip 11. The cooling arrangement is configured to enable the thermal energy to be exhausted to the rear region of the computer array (not shown). The sockets 13a, 13b, 13c, 13d are resilient to any increased heat that is provided as a consequence of this method of heat transfer.

Whilst well known traditional cooling fluids include water or water glycols, it is essential that the fluid 19 used in this arrangement is non flammable and an electrical insulator, therefore a mineral oil is used in this embodiment. A suitable commercial product is 3M's Novec® 7200 which has a boiling point of 76° C. and is used at an operational temperature of up to 70° C. to ensure that the liquid 19 does not boil so as to provide a single phase cooling arrangement. Further the liquid 19 is located in a sealed unit such that the liquid 19 does not evaporate. All temperature values are taken to be at 1 atmosphere. Use of such coolant oils enables a more efficient heat transfer between components and the subsequent transfer of heat to the ambient environment or heat sink via the heat conductive body of the enclosure. This heat is further conducted via the power strips external surface.

The heat at the rear of the servers that would usually have a negative affect on the relays is prevented from reaching the relays of the controller of the smart power strip due to the relays being encased in the liquid. Any heating of the relays is efficiently transferred to the fluid 19 and then conducted outwardly via the walls of the casing 18.

Using a liquid 19 with the above-mentioned pre-prescribed properties ensures that the electrical transfer means, e.g. cables can be passed through the liquid 19 to enable power transfer, sensed data transfer and other electrical signals or control instructions to be passed to the control unit 14. Therefore, wires 26 and cables 20 must pass through the casing 8 and the fluid 19 before reaching the controller components. This requires the need for a seal 27, 27', for example a gasket or o-ring to be applied around the entry point of the wire 26 or cable 20 as it passes through a wall 18a, of the casing 18 thereby preventing any leakage of the fluid 19 from the casing and ensuring that the interior of the casing 18 is hermetically sealed.

The user interface 15, which is displayed in more detail in FIG. 3 is in the form of a display panel, is located on an external surface 18a of the casing 18. A non-thermally conducting layer 28, for example a halogen free plastic material, in this instance a halogen free Nylon is sandwiched between the adjacent side of the user interface panel and the casing 18 so as to protect the components in the panel from any thermal energy from the casing 18.

The display panel is attached to the casing via a fixing means, for example screws (not shown).

The viscosity is of the liquid 19 is selected to permit efficient convection of the liquid 19 to ensure heat is transferred from the vulnerable area i.e. the relays 16. A suitable viscosity range is 0.7-0.8 cSt.

As computers are becoming increasingly resilient to higher temperatures the power strip 11 of the invention ensures that the power strip 11 does not provide a constraint to the optimal operation of a data centre (particularly a large data centre having a high power density compute whereby more heat is generated). This power distribution assembly 11 can be applied to existing data centre infrastructures and offers a more environmentally friendly arrangement which alleviates the need for excessive active cooling components for the computer array by focussing on the intelligent components of the power strip instead.

Therefore, the invention offers an improved cooling solution so as to meet the demand of increased power density in high compute data centres that require the use of smart power strips.

Various modifications to the principles described above would suggest themselves to the skilled person. For example, the fluid 19 may be replaced by an alternative heat conducting (and electrically insulating) fluid, for example it may be based on liquid Teflon. Rather than solely relying on convection of the fluid 19, the movement of the heated fluid 19 can be controlled by pumps (not shown) or another known agitation means (not shown) so as to increase the flow of the coolant to further improve the effectiveness and efficiency of the device by providing efficient contact between the heated fluid/coolant with a heat exchanger.

Further the single phase technique (whereby the fluid remains in the liquid state at all times), can be replaced with a double phase technique (not shown) if desired whereby the fluid comprises a liquid reservoir and a space above the reservoir for receiving gas. In this second embodiment of the invention, the boiling point of the fluid 19 is selected to be lower than that used for the single phase technique and any heating of part of the liquid to the boiling point will force part of the liquid 19 to boil and the resulting gas to rise such that it is stored in the space where it comes into contact with a condenser (for example a metal coil) causing the gas to cool and recondense it to the liquid state whereby it falls back down to the liquid reservoir.

The support structure 12 may be formed of other rigid and conductive materials, for example other types of metal, carbon fibres and composite materials as desired.

Figure 4:
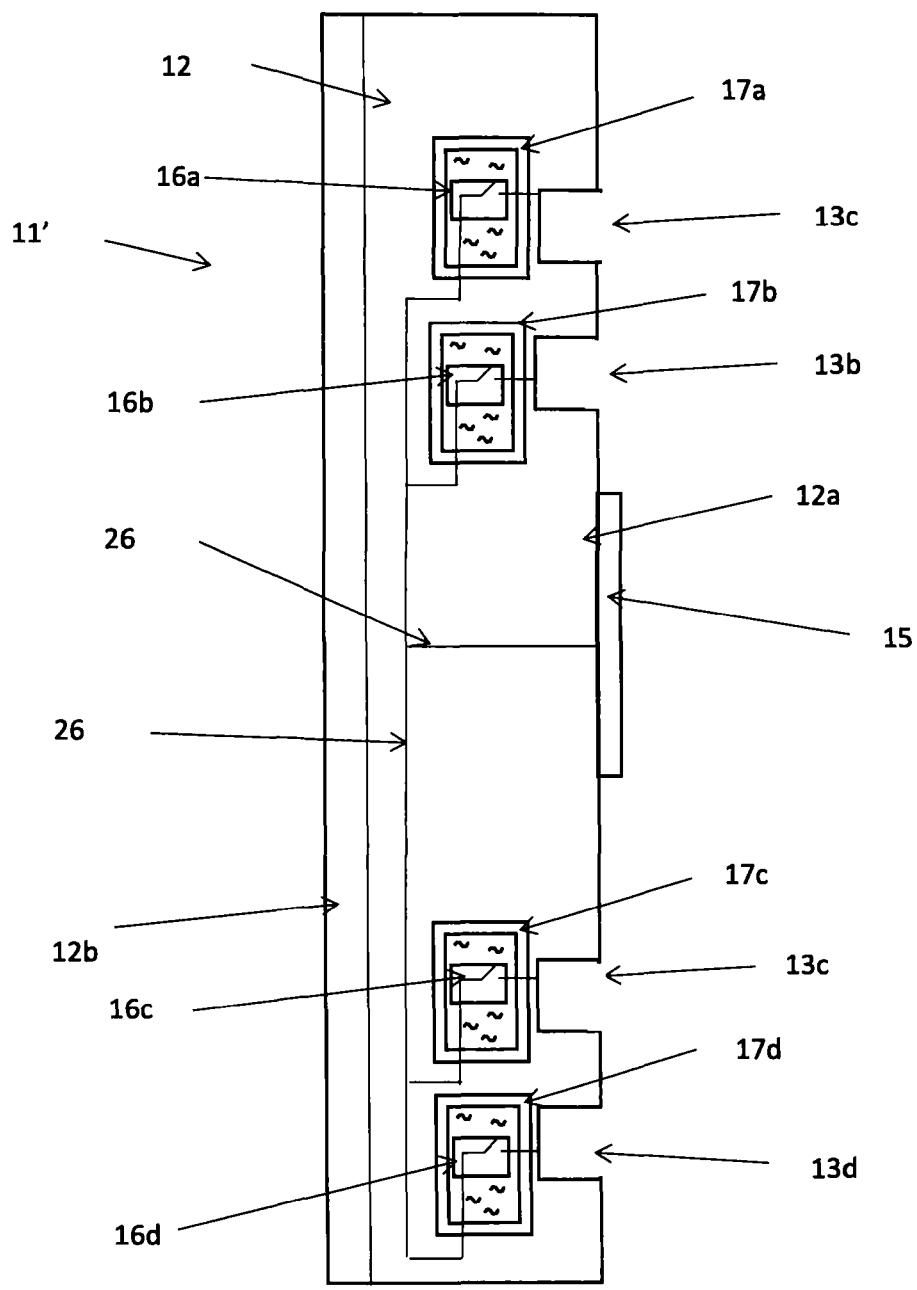
FIG. 4 is a schematic of the power distribution unit according to a second aspect of the invention.

The cooling arrangement 17 of the invention as shown in FIG. 2, FIG. 3 and FIG. 4 is an integral part of the power strip 11 and is inserted at the point of manufacture. It is envisaged that a retrofittable device comprising a first and second part attached together around the relevant region of an existing power strip may be applied, although a seal must be successfully implemented where the retrofittable cooling arrangement contacts the side edge of the user interface panel to ensure the user has access to the buttons 29 contained thereon.

In the above-described invention the relays 16 are co-located at the control unit which is a central unit 14 located on the support 12 of the power distribution assembly 11. However, in standard systems the relays 16 may be located adjacent to the sockets 13a, 13b,13c, 13d and as such the cooling would be required to extend along the length of the support structure 12 of the power distribution assembly 11 i.e. a single extended reservoir as shown in FIG. 4 may be provided or multiple cooling reservoirs can be applied to each of the individual relays. In both of these cases the reservoirs would be hermetically sealed and permit the passage of electrical cable 20 or wires 26 from within the fluid reservoir 19 to an external region as described previously so as to permit electrical contact between the relay 19 and the socket 13a, 13b, 13c, 13d.

In an alternative arrangement, the relays 16 may be co-located on a circuit board at a region that is separate and distinct from the central control unit 14 of the power distribution assembly 11 and at a location spaced apart from the central control unit 14. The casing will in this alternative embodiment be configured to surround the relay circuit board (not shown). Therefore, there may be provided a single cooling arrangement or there may be several regions within the power distribution assembly 11 that exhibit the containment of circuitry within a cooling reservoir 19.

In an alternative embodiment another electrically insulating fluid 19 may be applied, for example air or a vacuum, however the liquid arrangement is preferred since it provides a greater thermal conductivity reduces complexity of manufacture and maintenance.

The insulating layer 28 to be used in the data centre need not be halogen free nylon and may instead be polyphenylene sulphide (PPS) or a halogen free liquid crystal polymer (LCP) or another suitable material with the same property.

It is worthwhile to reiterate that instead of being controlled by the user interface hardware, the controller can be controlled using an IP based network via a cable, optic fibre, copper or wireless.

Importantly the cooling effect is directed only to a small area containing the components. This alleviates the need to use well known forced air or other fluid arrangements which are typically used to cool larger bulk areas, and which require a significant amount of power to successfully force the air through the interior of or along the outer surface of the power strip. Beneficially the fluid remains within the casing and relies on a combination of conduction and convection effects to remove heat from the components. The enclosure is provided by at least one wall that does not form the power strip housing itself. Therefore the casing can be said to be separate and distinct from the smart power strip housing itself.

The invention claimed is:

1. A power distribution assembly comprising:
   at least one controller having located therein at least one heat sensitive component; and
   at least one cooling arrangement located inside the power distribution assembly and comprising a casing configured to contain a coolant, at least a portion of the coolant being configured to come into contact with at least part of the controller and/or the at least one heat sensitive component for transferring heat away from the at least one controller and/or the at least one heat sensitive component towards at least one wall of the casing,
   wherein at least part of the casing is separate and distinct from an external wall of the power distribution assembly, so as to create a void region which is separate and distinct from a void created by the external wall of the power distribution assembly.

2. The power distribution assembly according to claim 1, wherein the controller and/or heat sensitive component is substantially immersed in the coolant.

3. The power distribution assembly according to claim 1, wherein, in use, an amount of coolant contained within the casing remains constant.

4. The power distribution assembly according to claim 1, wherein the coolant is hermetically sealed within the casing.

5. The power distribution assembly according 1, therein the coolant is a non-electrically conductive fluid.

6. The power distribution assembly according to claim 1, wherein the coolant is a mineral oil.

7. The power distribution assembly according to claim 1, wherein the at least one wall of the casing comprises a thermally conductive material.

8. The power distribution assembly according to claim 1, wherein the at least one wall of the casing comprises at least one protrusion that extends away from an internal and/or an external surface so as to increase a surface area of the at least one wall of the casing.

9. The power distribution assembly according to claim 1, wherein a heat sink is located in thermal communication with at least a portion of the at least one wall of the casing.

10. The power distribution assembly according to claim 1, wherein an electrical transfer means is configured to pass through the casing via a fluid tight seal.

11. The power distribution assembly according to claim 1, further comprising a fluid agitator for increasing a flow of the coolant within the casing.

12. The power distribution assembly according to claim 11, wherein the fluid agitator comprises a fluid pump.

13. The power distribution assembly according to claim 1, wherein when in use, an operational temperature at the controller and/or the heat sensitive component is of a value that is less than a boiling point of the coolant.

14. The power distribution assembly according to claim 1, further comprising a user interface to enable operation of the controller.

15. The power distribution assembly according to claim 14, wherein an electrical transfer means extends between the user interface and the controller so as to provide electrical communication between the user interface and the controller, whereby at least a portion of the electrical transfer means passes through the coolant.

16. The power distribution assembly according to claim 14, further comprising at least one connector located on the user interface to permit access and control of the controller from a remote location.

17. The power distribution assembly according to claim 16, wherein the connector comprises a RJ45 connection cable or USB.

18. The power distribution assembly according to claim 14, wherein the user interface is positioned adjacent to the casing and a thermally insulating layer is configured intermediate an external surface of the casing and the user interface.

19. The power distribution assembly according to claim 18, wherein the combination of the cooling arrangement, the controller and the user interface is located within an aperture in a support structure.

20. A method of cooling for use with a power distribution assembly, the power distribution assembly having located inside at least one casing for containing at least one controller comprising at least one heat sensitive component and a coolant, at least a portion of the at least one controller and/or the at least one heat sensitive component configured to come into contact with the coolant, the casing being separate and distinct from an external wall of the power distribution assembly, so as to create a void region which is separate and distinct from a void created by the power distribution assembly, the method comprising:
   transferring heat away from the at least one controller and/or the at least one heat sensitive component to at least one wall of the casing via the coolant.

21. The method according to claim 20, wherein the at least one controller and/or the at least one heat sensitive component is immersed in the coolant.

22. The method according to claim 20, further comprising hermetically sealing the coolant within the casing.

23. The method according to claim 20, wherein the at least one wall of the casing comprises thermally conductive material, the method further comprising conducting thermal energy from an interior of the casing to an exterior of the casing via the thermally conductive material.

24. The method according to claim 23, further comprising removing thermal energy from at least one wall of the casing by thermally coupling the at least one wall of the casing to at least one heat sink.

25. The method according to claim 20, further comprising agitating the coolant to increase a transfer of thermal energy from the at least one controller and/or at least one heat sensitive component to the casing via the coolant.

* * * * *

UNITED STATES PATENT AND TRADEMARK OFFICE
CERTIFICATE OF CORRECTION

| | |
|---|---|
| PATENT NO. | : 11,516,938 B2 |
| APPLICATION NO. | : 16/982878 |
| DATED | : November 29, 2022 |
| INVENTOR(S) | : Rudi Nizinkiewicz |

It is certified that error appears in the above-identified patent and that said Letters Patent is hereby corrected as shown below:

In the Claims

Column 9, Line 27, replace "The power distribution assembly according 1" with -- The power distribution assembly according to claim 1 --.

Signed and Sealed this
Eighteenth Day of April, 2023

Katherine Kelly Vidal
*Director of the United States Patent and Trademark Office*